United States Patent
Friedrichs et al.

(10) Patent No.: US 7,646,026 B2
(45) Date of Patent: Jan. 12, 2010

(54) SIC-PN POWER DIODE (75) Inventors: Peter Friedrichs, Nürnberg (DE); Dethard Peters, Höchstadt (DE); Reinhold Schörner, Grossenseebach (DE); Dietrich Stephani, Bubenreuth (DE)

(73) Assignee: SiCED Electronics Development GmbH & Co. KG, Erlangen (DE)

( * ) Notice: Subject to any disclaimer, the term of this patent is extended or adjusted under 35 U.S.C. 154(b) by 0 days.

(21) Appl. No.: 12/088,298

(22) PCT Filed: Sep. 19, 2006

(86) PCT No.: PCT/EP2006/066482

§ 371 (c)(1),
(2), (4) Date: Mar. 28, 2008

(87) PCT Pub. No.: WO2007/036456

PCT Pub. Date: Apr. 5, 2007

(65) Prior Publication Data

US 2008/0217627 A1    Sep. 11, 2008

(30) Foreign Application Priority Data

Sep. 29, 2005    (DE) .................... 10 2005 046 707

(51) Int. Cl.
*H01L 31/00* (2006.01)
*H01L 31/117* (2006.01)

(52) U.S. Cl. .......................... 257/77; 257/458
(58) Field of Classification Search ............ 257/77, 257/458, 655, 656, E29.104
See application file for complete search history.

(56) References Cited

U.S. PATENT DOCUMENTS

2004/0041225 A1 *  3/2004  Nemoto ................. 257/458

OTHER PUBLICATIONS

A. Elasser and T. P. Chow, "Silicon Carbide Benefits and Advantages for Power Electronics Circuits and Systems", 2002, Proceedings of the IEEE, vol. 90, No. 6, pp. 969-986.*

* cited by examiner

*Primary Examiner*—Thomas L Dickey
*Assistant Examiner*—Nikolay Yushin
(74) *Attorney, Agent, or Firm*—Laurence A. Greenberg; Werner H. Stemer; Ralph E. Locher (57) ABSTRACT

An integrated vertical SiC—PN power diode has a highly doped SiC semiconductor body of a first conductivity type, a low-doped drift zone of the first conductivity type, arranged above the semiconductor body on the emitter side, an emitter zone of a second conductivity type, applied to the drift zone, and at least one thin intermediate layer of the first conductivity type. The intermediate layer is arranged inside the drift zone, has a higher doping concentration than the drift zone, and divides the drift zone into at least one first anode-side drift zone layer and at least one second cathode-side drift zone layer. There is also disclosed a circuit configuration with such SiC—PN power diodes.

20 Claims, 5 Drawing Sheets

SIC-PN POWER DIODE

BACKGROUND OF THE INVENTION

1. Field of the Invention

The invention relates to an integrated vertical silicon carbide PN power diode and a circuit arrangement with such power diodes.

Semiconductor components are at present made from a semiconductor material such as silicon or also from gallium arsenide (GaA) and gallium phosphate ($Ga_3P_4$), which, however, have a low thermal, chemical and physical stability.

Silicon carbide (SiC) on the other hand is a semiconductor material that has a physically highly stable crystal structure particularly due to its wurtzite- or zinc-blende crystal lattice. Depending on the polytype, SiC monocrystals have a large energy band gap of 2.2 eV to 3.3 eV, which makes them thermally, and especially mechanically, particularly stable and resistant to radiation damage. This makes SiC very attractive for such semiconductor components, which are exposed to extreme temperatures or extreme operating or environmental conditions, such as prevail, for example, in automotive and railway engineering. Semiconductor components based on SiC are able to operate over a large voltage and temperature range, for example up to 650° C. to 800° C., have very good switching properties and low losses and can also be operated at very high working frequencies. Compared to silicon, SiC has a stronger breakdown field (up to 10 times higher than for silicon) due to the better material properties, a higher heat conductivity (more than three times higher than with silicon) and a larger energy band gap (2.9 eV for 6 H—SiC).

SiC is particularly suitable for power components with a very high blocking voltage (600 V up to a few kV), such as high voltage (switching) diodes and field-effect transistors. Such SiC semiconductor components are, for example, used in converters for electrical drives, in switched-mode power supplies or in uninterruptible power supply systems. The purpose of the use of higher operating voltages is usually to be able to convert larger electrical outputs (of a magnitude of some kilowatts) with the same current.

Because the SiC semiconductor technology is still relatively young and in many respects not yet optimized, a series of problems exist in the production of SiC-based semiconductor components, which are yet to be solved to enable SiC components to become a reality in many component variants and in large unit quantities. The particular reason for this is that the same processes used for silicon components cannot simply be used for the production of SiC components. For example, doping by diffusion is all but unrealizable for SiC. Furthermore, the electrical activation of the doping atoms applied during the ion implantation is relatively difficult to control with SiC. For the aforementioned reasons, SiC is at present advantageously used for semiconductor components that can be produced by relatively simple technology such as Schottky diodes, PN diodes and field-effect transistors.

Figure 1:
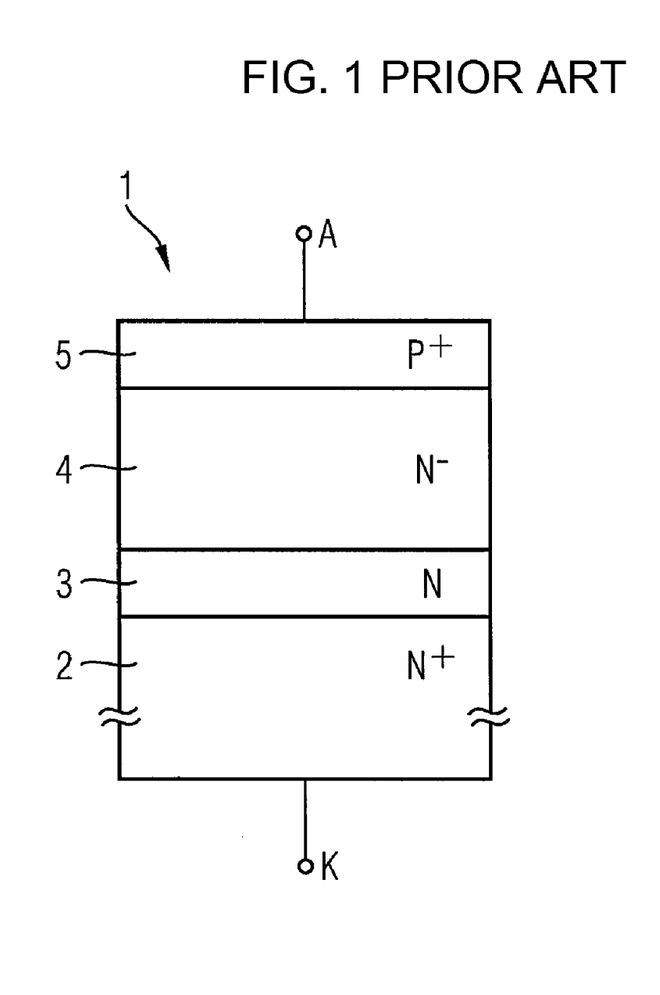
FIG. 1 A part section of a known SiC—PN power diode as an explanation of the problem.

To explain the general problem, FIG. 1 of the drawing shows a schematic part section of the construction of an SiC power diode. The SiC power diode with the reference character 1 contains a very thick N-doped SiC semiconductor substrate, which is, for example, part of an SiC semiconductor wafer. The back of the semiconductor substrate 2 is connected to a cathode terminal K. An N-doped buffer layer 3, a low N-doped drift zone 4 and a highly P-doped emitter zone 5, which is connected on the front to an anode terminal A, are mounted in series on the front of the SiC semiconductor substrate 2. The thickness of the drift zone 4 and its doping concentration essentially determines the blocking state characteristics of the power diode 1.

Figure 1A:
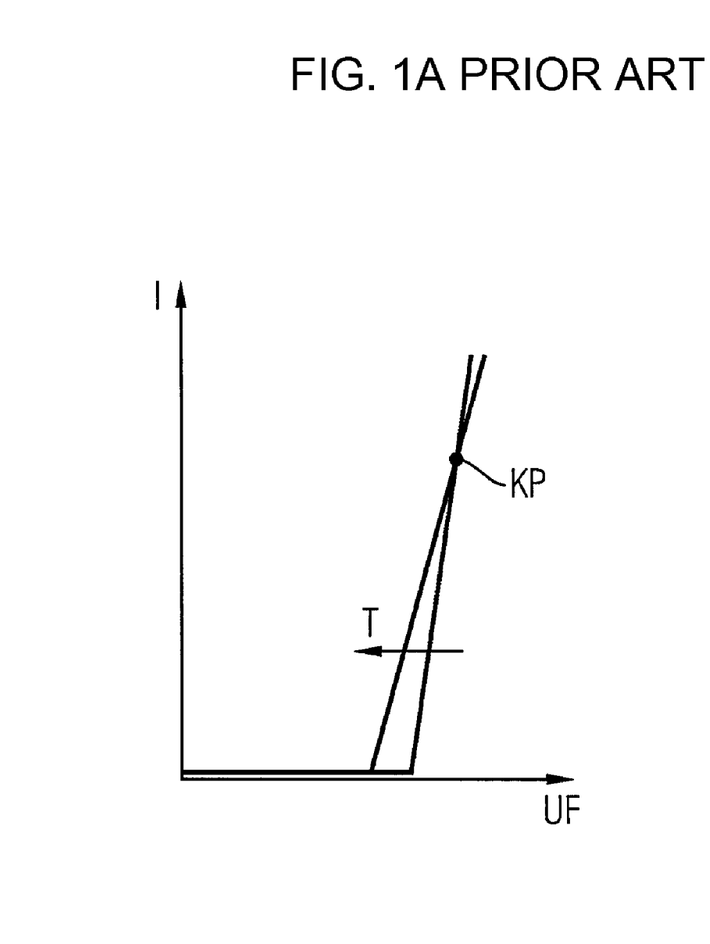
FIG. 1a An idealized current/voltage characteristic curve in the on-state mode of the SiC power diode from FIG. 1.

FIG. 1a shows an idealized form of a current/voltage curve of the SiC power diode from FIG. 1 relative to temperature T, with, on the abscissa, the forward voltage UF being shown and, on the ordinate, the current I flowing at the same time being shown. KP is the intersection point of both diode characteristic curves at high currents or high forward voltages. The working point normally used for an SiC power diode is typically below the intersection point KP of the diode characteristic curves.

FIG. 1a shows that the forward voltage UF reduces with increasing temperature T at a given injected current I. At a given impressed forward voltage UF, the diode current I increases with increasing temperature T. This phenomenon is also known as negative temperature coefficients (du/dt<0) at constant current. The diodes normally used e.g. silicon diodes, on the other hand have a positive temperature coefficient with the forward voltage UF also increasing at a constant diode current I with increasing temperature T.

The phenomenon of the negative temperature coefficient is on the one hand due to the service life of a minority charge carrier increasing with increasing temperature. In addition or alternatively, this phenomenon is also due to the contact resistance between the anode metalling and the highly P-doped emitter zone reducing with increasing temperature.

This particular phenomenon with an SiC SC power diode as described in FIG. 1a, i.e. the presence of a negative temperature coefficient, is unwelcome or even damaging, particularly where several SiC power diodes are connected in parallel because, due to technology-imposed differences between different power diodes, a uniform distribution of the total current to the various power diodes of the parallel circuit cannot usually be guaranteed. As a result, one of the power diodes of the parallel circuit therefore typically takes a higher diode current than the other power diodes, which has the direct effect of causing this power diode to suffer a greater increase in temperature than the other power diodes. Because of the negative temperature coefficient, this in turn causes the current even through this power diode to additionally increase due to the characteristic curve, thus leading to a further increase in temperature of this power diode.

This latter phenomenon typically quickly leads to failure of this power diode and thus of the complete diode parallel circuit. This is a condition that should, of course, be avoided.

BRIEF SUMMARY OF THE INVENTION

Against this background, the object of this invention is to provide an improved SiC power diode that has an improved thermal relationship particularly with regard to its current/voltage characteristic curve. A further object is to counteract the negative temperature coefficients when the SiC power diode is operated in the working point range.

At least one of the above objects is achieved by a power diode in accordance with the invention and/or by a circuit arrangement having the features of the invention.

One object of the invention is to provide an integrated vertical SiC—PN power diode, with a highly doped SiC semiconductor body of a first conductivity type, with a low-doped drift zone of the first conductivity type arranged above the semiconductor body on the emitter side, with an emitter zone of a second conductivity type applied to the drift zone, with at least one thin intermediate layer of said first conductivity type, said intermediate layer being arranged inside the drift zone, comprising a higher doping concentration than the drift zone and dividing the drift zone into at least one first anode-end drift zone layer and at least one second cathode-end drift zone layer.

A further object of the invention is provide a circuit arrangement, especially a power electronic assembly, with a common anode terminal, with a common cathode terminal and with a plurality of individual integrated vertical SiC—PN power diodes that are arranged with current-carrying paths parallel to each other and between the anode terminal and cathode terminal.

The technical principal of this invention is, in particular, to arrange in the area of the drift zone at least one intermediate layer of the same conductivity type as in the drift zone, with the intermediate layer having a significantly higher doping concentration than the drift zone.

By means of the intermediate layer arranged within the drift zone, the drift zone is divided into at least two part areas.

The part of the drift zone at the anode end (first drift zone layer) serves to form a space-charge region which is formed between the emitter zone and drift zone when a blocking voltage is applied to the PN transition. Ideally, this space-charge region extends on the drift-zone side to directly before the intermediate layer but, however, if possible not into the intermediate layer or the second drift zone layer lying underneath it. The part of the drift zone at the cathode end (second drift zone layer) functions as a temperature-dependent resistance that also increases with increasing temperature and is arranged more or less in series with the PN transmission, and thus with the diode between the emitter layer and drift zone. The resistance in the second drift zone layer increases with increasing temperature, which means that at a constant forward voltage the current flowing through this layer reduces in the same way. The problem of the negative temperature coefficient at a constant diode current, described in the introduction, can be counteracted in this manner. With a suitable dimensioning of the thickness of the first and second drift zone layers, PN power diodes, which similar to silicon have a positive temperature coefficient or at least a weak negative temperature coefficient, can be advantageously provided, as comprehensively shown in the following.

It is essential when dimensioning the intermediate layer arranged within the drift zone that this does not too strongly influence the blocking properties of the power diode and thus the space-charge region migrating out from the PN transition. On the other hand, this intermediate layer, or the charge carrier installed there, should compensate as far as possible for the resistance resulting through the drift zone. These more or less contradictory requirements are typically optimized by a compromise in the dimensioning of the doping concentration and the thickness of the intermediate layer or of the drift-zone layers. Generally, this means that the intermediate layer is arranged within the drift zone in such a way that when the PN power diode is in forward mode the bipolar modulation of the drift zone is either not impaired or at least only negligibly impaired and that at the same time the blocking characteristics of the PN power diode are either not impaired or at least only slightly impaired.

This means that several power diodes can now also be operated in parallel circuits without the danger of one of these power diodes, and consequently also the complete power diode parallel circuit, failing. The particular advantage of this is that SiC power diodes that have a very high dielectric strength can now be used for very high currents by means of parallel circuitry.

Advantageous embodiments and developments of the invention result from the further subclaims and from the description in conjunction with the figures of the drawing.

In a first, very advantageous embodiment (at least) one single intermediate layer, passing laterally through the complete drift zone is provided. This intermediate layer thus separates the drift zone into the first and second drift zone layer, which are therefore separated from each other by the intermediate layer.

In an alternative, but nevertheless very advantageous, embodiment, the intermediate zone is formed as a grid-type layer structure passing laterally through the complete drift zone. The grid-type intermediate layer is cohesive in this case but the first and second drift zone layers are not separated from each other by the intermediate layer but instead rather more connected to each other by the holes in the grid structure.

In a particularly preferred embodiment, a plurality of island-shaped intermediate layers, separated laterally from each other and vertically arranged at approximately the same level, are provided in the drift zone. By means of an island-shaped intermediate layer structure of this kind, the positive total temperature coefficient of the SiC power diode, already described above, can be realized more simply than by means of a homogenous intermediate layer passing through the complete drift zone. Admittedly, this structure is, particularly due to the difficulty in processing SiC, technically very much more expensive to produce than a continuous semiconductor structure, which for example can be very easily produced by epitactic deposition. By means of such island-shaped intermediate layers, or also by means of a grid-shaped intermediate layer structure, very stable avalanche effects can be produced due to impulse ionization.

In a very advantageous embodiment, a buffer zone of the first conductivity type is provided. This buffer zone is arranged so that it passes laterally between the drift zone and the semiconductor body. Preferably, this buffer zone completely separates the drift zone and the semiconductor body from each other. Compared with the adjacent drift zone, the buffer zone has a higher doping concentration and a lower doping concentration compared with the adjacent semiconductor body. The provision of a buffer zone is then advantageous if the SiC power diode is to be of a so-called punch-through (PT) design, in order in this way to stop a space charge region migrating from the PN transition from reaching the heavily doped semiconductor body. In the case of a so-called non-punch through (NTP) design of the power diode, a buffer layer of this kind is not absolutely necessary, but not necessarily disadvantageous. Such PT and NPT designs and their functions are generally known with IGBT (Insulated Gate Bipolar Transistor) semiconductor elements, so that it is not necessary to deal further with these structures and their function here.

Typically, the intermediate layer has a lower doping concentration than the semiconductor body.

In a typical embodiment, the first drift zone layer, which thus borders on the PN transition, has a lower doping concentration than the second drift zone layer. Typically, but not necessarily, the second drift zone layer has a higher doping concentration, in the region of 5% to 40%, especially in the region of 10% to 20%, than the first drift zone layer lying above it. Conceivably, provided the process is technically feasible, it would of course also be possible to have the same doping concentration if both drift zone layers were within the drift zone. Technologically, this is however very difficult to achieve because in a case of an intermediate layer epitactically grown onto the second drift zone layer with the set process parameters being otherwise the same, the first drift zone layer applied thereon usually has a slightly different doping concentration.

In a typical embodiment, the anode zone has a very high doping concentration in the area between $1\times10^{18}$ cm$^{-3}$ and $1\times10^{22}$ cm$^{-3}$. Advantageously, the doping of the anode zone is between $1\times10^{19}$ cm$^{-3}$ and $1\times10^{21}$ cm$^{-3}$. The use of an anode zone with very high doping concentration on the one hand has the advantage that it enables a high emitter efficiency to be realized and on the other hand it enables a better electrical contacting of an anode metallization to be guaranteed, which in contrast to silicon, is always difficult with SiC.

In a preferred embodiment, the continuous intermediate layer or the plurality of island-shaped intermediate layers each has a doping concentration of between $1\times10^{18}$ cm$^{-3}$ and $1\times10^{20}$ cm$^{-3}$. Advantageously, the doping concentration of these intermediate layers lies between $1\times10^{19}$ cm$^{-3}$ and $5\times10^{19}$ cm$^{-3}$. A continuous intermediate layer or a plurality of island-shaped intermediate layers thus has a significantly higher doping concentration than the surrounding drift zone layers. In the case of a continuous intermediate layer, the doping concentration is typically greater than that of the drift zone by a magnitude of 1 to 2 and in the case of a plurality of island-shaped intermediate layers their doping concentration is greater than the adjacent drift zone layers by a magnitude of approximately 1 to 3. An order of magnitude is a magnitude to the power of 10, i.e. a factor of 10; orders of magnitude of 2 and 3 are therefore $10^2=100$ or $10^3=1000$.

In a typical embodiment, the at least one intermediate layer has a layer thickness in the 0.1 µm to 20 µm range and especially in the 1 µm to 5 µm range. It is generally the case that for a continuous intermediate layer, the layer thickness of said layer is greater than in the case of the island-shaped or grid-shaped intermediate layers. The latter typically have a layer thickness of less than 1 µm, whereas in the first case a single continuous intermediate layer has a thickness of least a few µm.

In a typical embodiment, the at least one intermediate layer is arranged in the bottom half of the drift zone, preferably in the bottom third of the drift zone, relative to a PN transition of the power diode. The precise arrangement of this intermediate layer relative to the drift zone is in this case an optimization measure, which is typically determined by simulation. In a similar manner, its layer thickness and doping concentration are also typically determined by simulation.

In a typical embodiment, the semiconductor body has a back surface and a front surface. The back surface has a large surface area electrical contact with a cathode metallization functioning as a cathode terminal, i.e. is in ohmic contact. The front surface is formed by the emitter zone and is in a large surface area electrical contact with an anode metallization functioning as an anode terminal. Nickel compounds, such as nickel-aluminum alloys, are particularly suitable in this case as contacts. Other alloys such as those based on tungsten, titanium, tantalum, silicides or similar are also conceivable.

Preferred applications of the inventive circuit arrangement are rectifiers, converters and/or parts of a power circuit breaker.

The invention is explained in more detail in the following by means of the exemplary embodiments given in the diagrammatic figures of the drawing. The drawing shows:

DESCRIPTION OF THE INVENTION

Elements, features and signals that are the same or functionally similar have been given the same reference characters in the figures of the drawing.

In the following description of figures and in the complete patent application, the term "SiC" refers to all important crystal polytypes of silicon carbide and thereby particularly to 6H-, 4H-, 2H-, 3C- and 15R-polytypes. It should similarly be pointed out that in this patent application PN power diodes and bipolar power diodes are always understood to be SiC based even if only power diodes or SiC power diodes are referred to. With SiC as a semiconductor material, the applied doping frequently does not correspond to the so-called electrically-active doping provided for the current flow. Doping in this case always means the doping applied to the respective semiconductor body.

Figure 2:
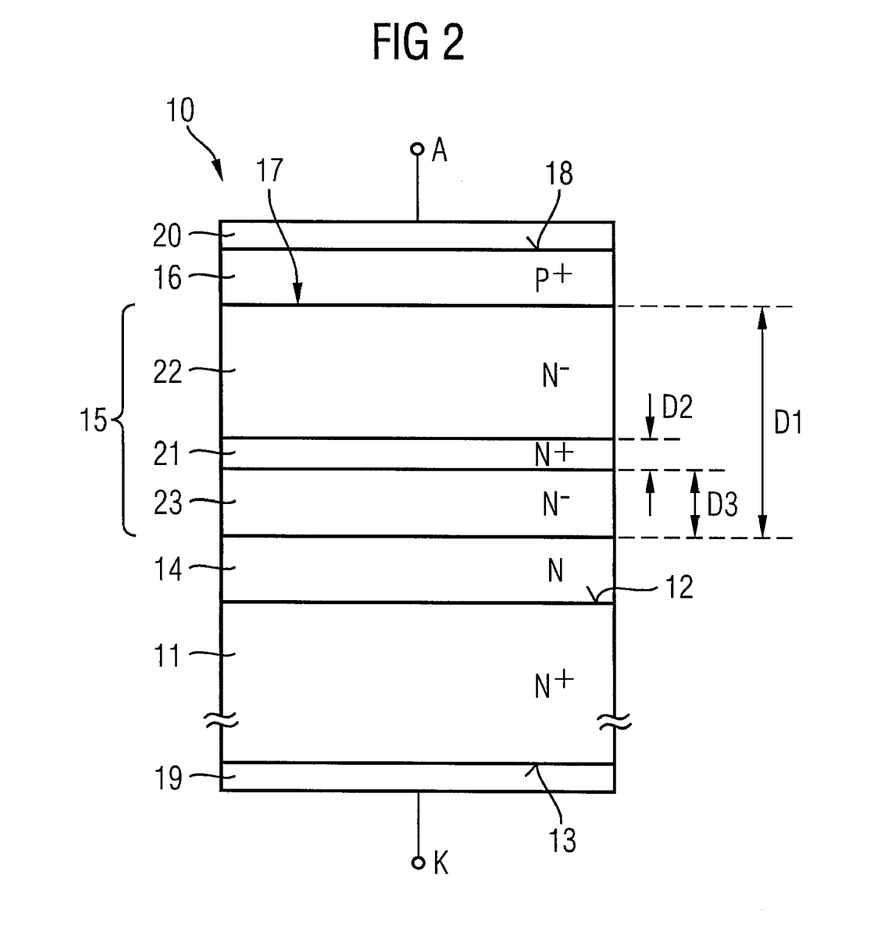
FIG. 2 A part section of a first exemplary embodiment of an inventive SiC power diode.
Figure 2A:
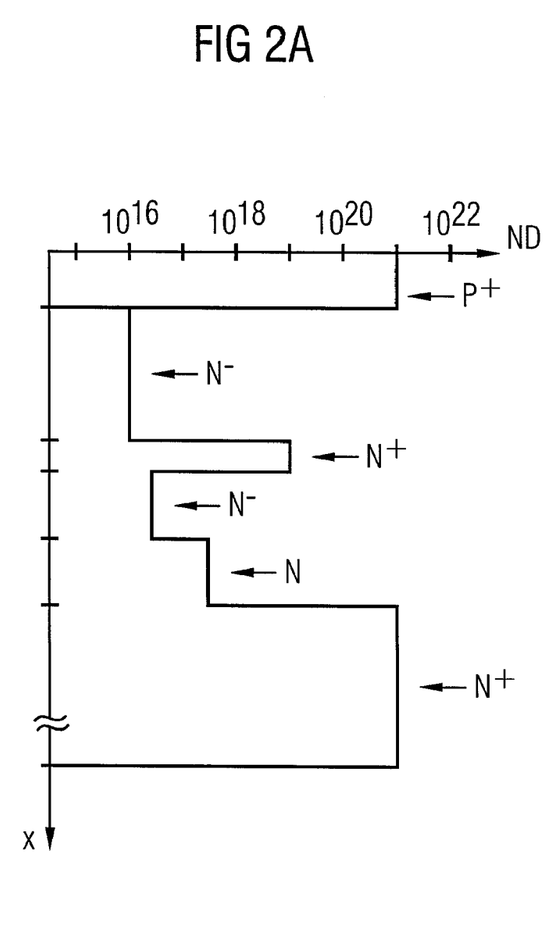
FIG. 2a The doping relationships of the various layers of the power diode from FIG. 2.

FIG. 2 shows a part section of an inventive SiC power diode. FIG. 2a shows the doping relationships of the various areas and layers of the power diode from FIG. 2, with the depth x of the SiC power diode being shown on the abscissa from the front at the anode-end in linear form and the doping concentration ND being shown on the ordinate in logarithmic form as a unit cm$^{-3}$.

The power diode with the reference character 10 contains an SiC semiconductor body 11 or an SiC substrate. The SiC semiconductor body 11, which for example is part of an SiC wafer, has a strong N doping. The SiC semiconductor body 11 has a front surface 12 and a back surface 13.

On the front surface 12, a buffer layer 14 is applied to the SiC semiconductor body 11. The buffer layer 14 has a lower doping concentration than the semiconductor body 11. The buffer layer 14 guarantees a PT design of the power diode 10 and is designed to prevent a space-charge region extending from a PN transition into the semiconductor body 11.

A weak N-doped drift zone 15 is applied to the buffer zone 14. The doping concentration of the drift zone 15 is typically lower than the buffer zone 14 by a magnitude of 1 to 2. The drift zone 15 has a layer thickness D1 which varies between 3 μm and 100 μm depending upon the doping concentration of the drift zone 15 and the blocking characteristics of the power diode 10.

A strongly P-doped emitter zone 16 is applied to the drift zone 15. A boundary area between the drift zone 15 and the emitter zone 16 thus defines a PN transition 17 of the power diode 10, from which, in the blocking state, a space-charge region can migrate into the drift zone 15 on the one hand and into the emitter zone 16 on the other.

The SiC power diode developed in this way has a front surface 18 which forms the surface of the emitter zone 16 and a back surface 13 which is identical to the back surface 13 of the semiconductor body 11. A large area of cathode metallization 19, which is connected to a cathode terminal K, is applied to the back surface 13. A large area of anode metallization 20, which is connected to an anode terminal A, is applied to the front surface 18. Suitable materials are used in each case depending on the type of doping of the corresponding adjacent semiconductor layer (i.e. N or P) or of the doping concentration of said layer, with nickel alloys and especially nickel-aluminum alloys (NixAly) having been shown to be particularly advantageous in this case. It is also particularly advantageous if the semiconductor layer 11, 16 lying under the particular metallization 19, 20 has a highest possible doping concentration to guarantee an ohmic contact with the lowest possible contact resistance.

According to the invention, a thin intermediate layer 21 is now arranged in the drift zone 15. The intermediate layer 21 has a layer thickness D2 which is typically between 0.1 and 5 μm, usually approximately 1 μm. The intermediate layer 21 is strongly N-doped and has a doping concentration that is higher than the surrounding areas of the drift zone 15 by a magnitude of at least one to three.

In the example in FIG. 2 the intermediate layer 21 is formed as a single layer passing laterally through the complete drift zone 15, so that the drift zone 15 is divided into a first anode-end drift zone part layer 22 and a second cathode-end drift zone part layer 23, which are spaced apart from each other by the intermediate layer 21. In this exemplary embodiment, both drift zone part layers 22, 23 have a somewhat similar doping concentration, with the cathode-end drift zone part layer 23 having a doping concentration which is typically in the range of 5 to 40% more than the anode-end drift zone part layer 22 (see FIG. 2a). Depending on the doping concentration in the drift zone 15 and, depending on the required blocking behavior, it is advantageous if the intermediate layer 21 is in the bottom half (D3≦½*D1), especially in the bottom third (D3≦⅓*D1), of the drift zone 15.

For the production of the power diode 10, the buffer layer 14, the second drift zone part layer 23, the intermediate layer 21 the first drift zone part layer 22 and the emitter layer 16 are epitactically grown in succession on the semiconductor body 11. The doping of these layers 14, 16, 21-23 takes place during the epitaxy by adding the appropriate required doping material in the corresponding required dose. Nitrogen or phosphorus are the preferred suitable material for doping the N-doped layers 14, 21, 22, 23. Alternatively, the individual layers can also be doped by ion implantation. A high-temperature treatment is, of course, necessary after the ion implantation for the healing of crystal damage and for electrical activation of the atoms of the applied doping substance. A particular advantage is obtained if the high-temperature treatment is carried out during the ion implantation, for example by using high-temperature ion implantation.

Figure 3:
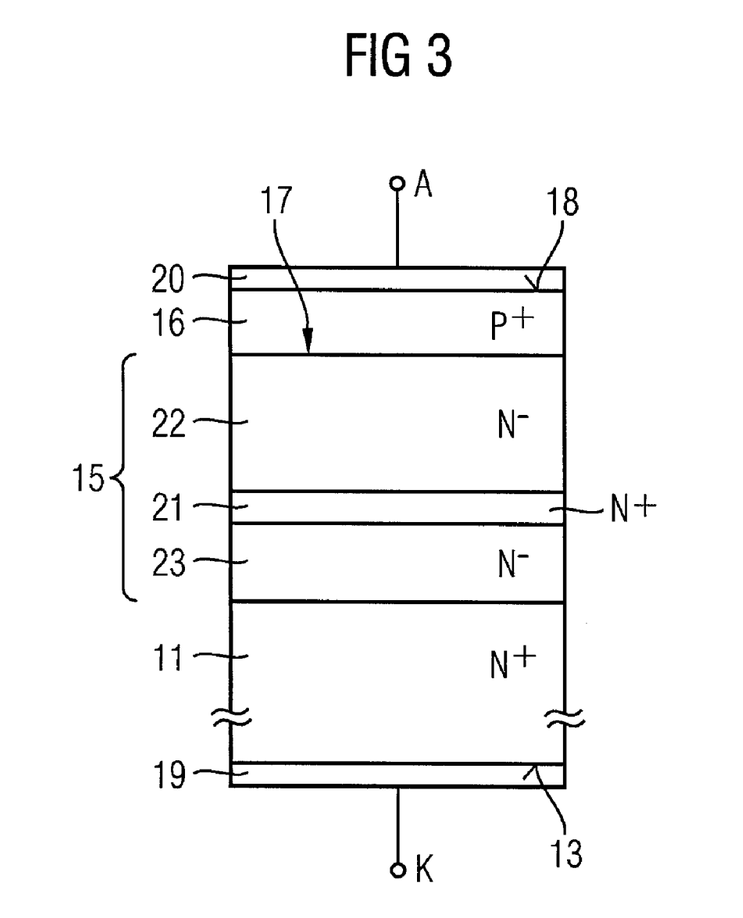
FIG. 3 A part section of a second exemplary embodiment of an inventive SiC power diode.

FIG. 3 shows a part section of a second exemplary embodiment of an inventive SiC power diode. In contrast to the inventive example in FIG. 2, the power diode 10 in this case has no buffer layer 14, with an NPT design thus being implemented. In this case, the drift zone 15 is therefore applied directly to the semiconductor body 11.

Figure 4:
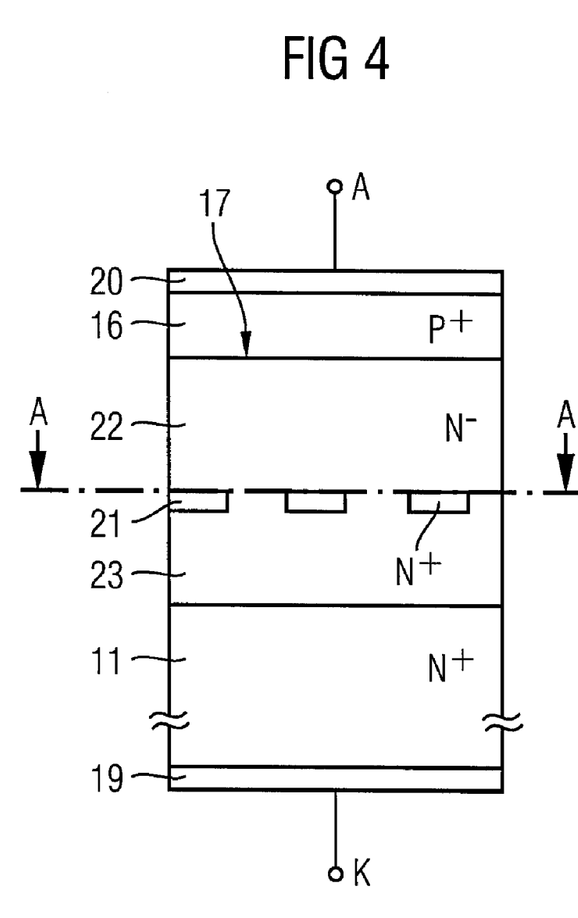
FIG. 4 A part section of a third exemplary embodiment of an inventive SiC power diode.

FIG. 4 shows a part section of a third exemplary embodiment of an inventive SiC power diode. In contrast to the SiC power diode in FIG. 1, the intermediate layer 21 in this case is not formed as a layer passing laterally through the complete drift zone 15, so that both drift zone part layers 22, 23 are connected to each other in the area between two adjacent intermediate zones 21. To realize the intermediate layer 21 in FIG. 4, various layouts are possible in principle, which are briefly explained using the layout drawings in FIGS. 4a and 4b.

Figure 4A:
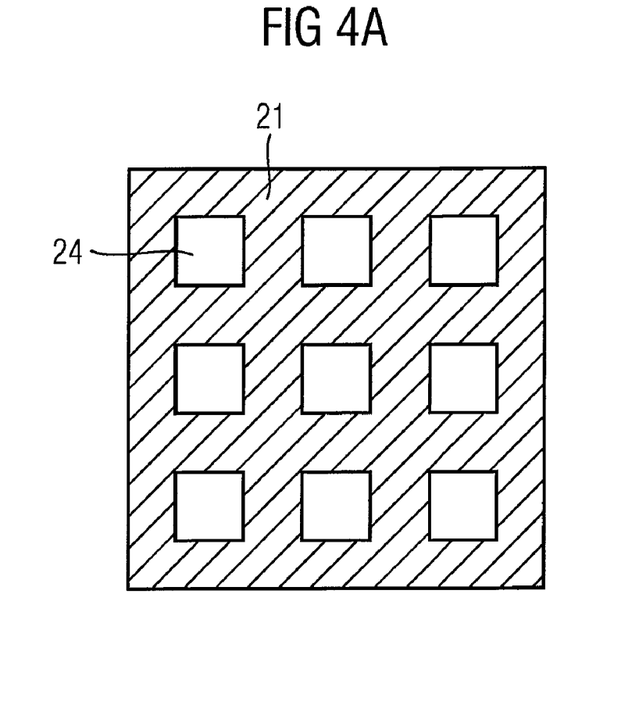
FIG. 4a A plan view of the intermediate layer of the SiC power diode from FIG. 4, showing its structure.

The embodiment in FIG. 4a shows a grid-shaped cohesive intermediate layer 21 along the line A-A (from FIG. 4). This intermediate layer 21 has more or less square holes 24 in the layout, with both drift zone part layers 22, 23 directly connected to each other.

Figure 4B:
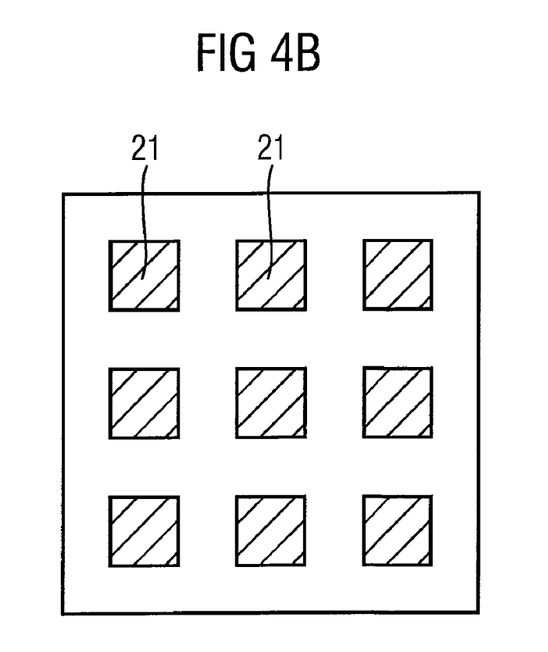
FIG. 4b A further plan view of the intermediate layer of the SiC power diode from FIG. 4, showing its structure.

In the embodiment in FIG. 4b, a plurality of island-shaped intermediate layers 21 is provided, which in the layout (line A-A) have a square shape and are laterally separated from each other. These various intermediate layer islands 21 are arranged vertically at approximately the same depth. The drift zone part layers 22, 23 are directly connected to each other in the areas between the intermediate layers 21.

In FIGS. 4a, 4b, square structures were chosen for the holes 24 (FIG. 4a) or the intermediate islands 21 (FIG. 4b) simply as an example. It is obvious that in this case also any other contour of these structures 21, 24 can be chosen, for example a round, oval, triangular, rectangular, hexagonal contour etc. It is also not necessary for these structures 21, 24 to have the same contours.

It is assumed that the intermediate layer 21 in this case is generated by a masked ion implantation. Following the ion implantation, it is then necessary, after removing the fitted mask, to carry out a high-temperature treatment to heal crystal damage and to electrically activate the atoms of the applied doping substance.

Alternatively, it can also be provided that the intermediate layer 21 is applied by epitaxy. In this case, of course, the masking must first be applied to the second drift zone part layer 23. After the epitactic growth of the intermediate layer (s) 21, the mask must also be removed. Then, of course, depending on the thickness of the intermediate layer(s) and the thickness of the first drift zone layer 22, the surface of the first drift zone layer 22 would show more or less pronounced waves or steps.

Figure 5:
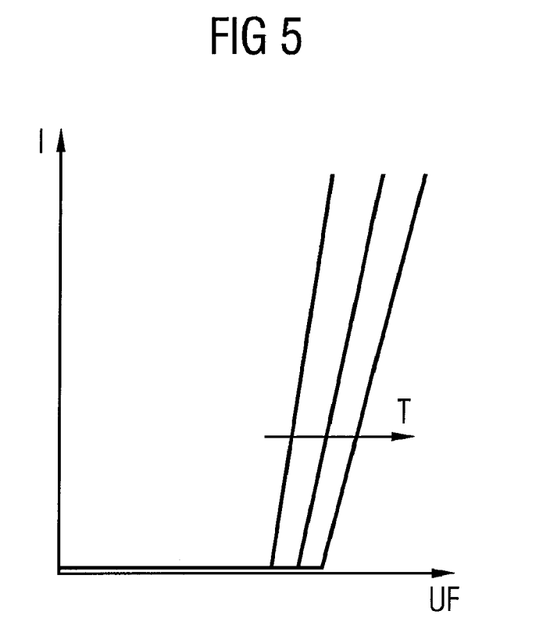
FIG. 5 A current/voltage characteristic curve of an inventive SiC power diode in the on-state mode, corresponding to FIGS. 2 and 3.

FIG. 5 shows the qualitative characteristic curve of an inventive power diode corresponding to FIGS. 2-4 relative to temperature. It can be seen that due to the introduction of highly doped intermediate layers 21 within the drift zone 15 and a suitable choice of their doping concentration as well as the thickness D2 of the intermediate layer 21 and their arrangement within the drift zone 15, a positive temperature coefficient is realized in such a way that with an impressed current I the forward voltage UF in the on-state mode also increases with increasing temperature T.

Figure 6:
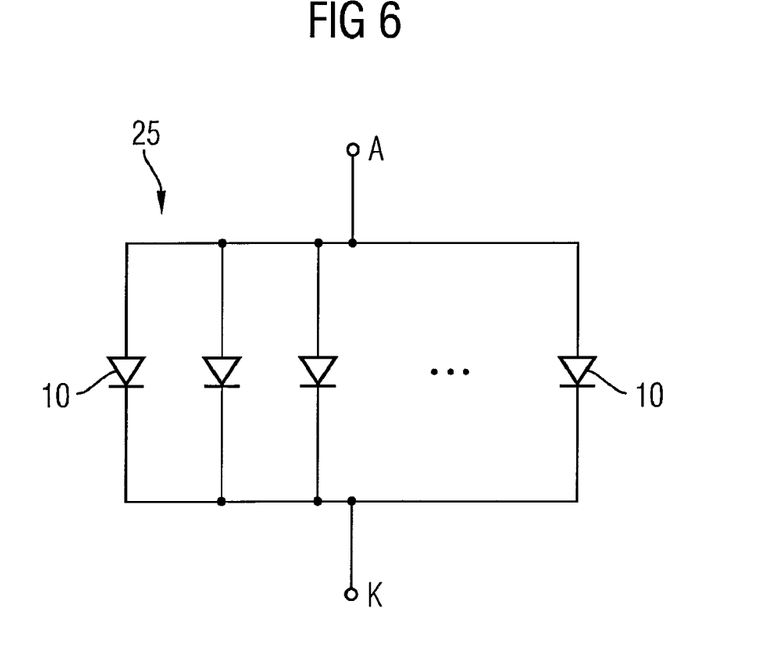
FIG. 6 A circuit arrangement of a power component with several inventive SiC power diodes.

FIG. 6 shows a preferred circuit arrangement of the inventive power diode. In this case, FIG. 6 shows a circuit arrangement 25, for example a power electronic assembly, with a plurality of inventive power diodes 10. These power diodes 10 are arranged parallel to each other relative to their current-carrying paths and connected between a common anode terminal A and a common cathode terminal K. The particular advantage in this case is that any number of inventive power diodes 10 can be arranged in circuit without incurring the danger that then, for example due to a temperature coefficient that is too negative, at least one of these power diodes would carry a higher current than the others and thus lead to an unwanted temperature rise in this power diode, which would result in failure of this power diode. Such power rectifiers are therefore designed to take high blocking voltage due to the structure of the power diode and at the same time to carry a very high current. These circuit arrangements are thus particularly suitable for high performance converters, high performance rectifiers, high performance circuit breakers and similar.

Although this invention has been described using preferred exemplary embodiments, it is not limited to such but instead can be modified in a variety of ways and means.

It is obvious that due to the replacement of the N conductivity types by P conductivity types and vice versa, and by variation of the doping concentrations and of the layer thickness and spacing, any number of modified power diode structures can be provided without departing from the essence of this invention. The production methods were also given merely by way of example, without the invention being, however, limited to same. Also the materials used (with the exception of SiC), especially those of the metallization and doping substances, should be seen merely as examples and could also be replaced by other suitable materials.

The invention claimed is:

1. An integrated vertical SiC—PN power diode, comprising:
    a highly doped SiC semiconductor body of a first conductivity type;
    a lightly-doped drift zone of the first conductivity type formed at an emitter end above said semiconductor body;
    an emitter zone of a second conductivity type formed on said drift zone;
    at least one thin intermediate layer of the first conductivity type disposed inside said drift zone, said intermediate layer having a higher doping concentration compared with said drift zone and dividing said drift zone into at least one first, anode-end drift zone layer and at least one second, cathode-end drift zone layer, and
    a space-charge region capable of extending into said drift zone at said first anode-end drift zone from a transition between said emitter zone and said drift zone when a blocking voltage is applied to said transition, said intermediate layer laying outside of said space-charge region when said blocking voltage is present.

2. The power diode according to claim 1, wherein said intermediate layer is at least one intermediate layer passing laterally through the entire said drift zone and separating said first drift zone layer from said second drift zone layer.

3. The power diode according to claim 1, wherein said intermediate layer is a lateral, grid-shaped layer structure passing through the entire said drift zone.

4. The power diode according to claim 1, wherein said intermediate layer is formed of a plurality of island-shaped intermediate layers, laterally spaced apart from one another and having a common height in a vertical direction.

5. The power diode according to claim 1, which further comprises at least one buffer zone of the first conductivity type disposed laterally between said drift zone and said semiconductor body and having a higher doping concentration than said drift zone adjacent said buffer zone and a lower doping concentration than the adjoining said semiconductor body.

6. The power diode according to claim 1, wherein said intermediate layer has a lower doping concentration than said semiconductor body.

7. The power diode according to claim 1, wherein said first drift zone layer has a lower doping concentration than said second drift zone layer.

8. The power diode according to claim 1, wherein said emitter zone has a high doping concentration in a range between $1*10^{18}$ cm$^{-3}$ and $1*10^{22}$ cm$^{-3}$.

9. The power diode according to claim 8, wherein the doping concentration of said emitter zone lies in a range between $1*10^{19}$ cm$^{-3}$ and $1*10^{21}$ cm$^{-3}$.

10. The power diode according to claim 1, wherein said intermediate layer has a doping concentration in a range between $1*10^{18}$ cm$^{-3}$ and $1*10^{20}$ cm$^{-3}$.

11. The power diode according to claim 10, wherein the doping concentration of said intermediate layer lies in a range between $1*10^{19}$ cm$^{-3}$ and $5*10^{19}$ cm$^{-3}$.

12. The power diode according to claim 1, wherein said intermediate layer has a higher doping concentration in a ratio of 1 to 3 than the adjoining said first and second drift zone layers.

13. The power diode according to claim 1, wherein said intermediate layer has a layer thickness in a range from 0.1 μm to 20 μm.

14. The power diode according to claim 1, wherein the layer thickness of said intermediate layer lies in a range from 1 μm-5 μm.

15. The power diode according to claim 1, wherein said intermediate layer is disposed in a bottom half of said drift zone, relative to a PN transition of the power diode.

16. The power diode according to claim 15, wherein said intermediate layer is disposed in a bottom third of the drift zone.

17. The power diode according to claim 1, wherein said semiconductor body has a back surface formed with an electrically conducting surface contact with a cathode metallization, and said emitter zone has a front surface formed with an electrically conducting surface contact with an anode metallization.

18. A circuit configuration, comprising:
    a common anode terminal;
    a common cathode terminal; and
    a plurality of individual integrated vertical SiC—PN power diodes according to claim 1 connected in parallel with one another with respect to the current carrying paths thereof and between said common anode terminal and said common cathode terminal.

19. The circuit configuration according to claim 18, forming a power electronic assembly.

20. The circuit configuration according to claim 14 forming a rectifier, a converter, or a part of a power circuit breaker.

* * * * *